(12) United States Patent
Tunks et al.

(10) Patent No.: US 11,340,571 B2
(45) Date of Patent: May 24, 2022

(54) SYSTEM WITH RETROFIT ENHANCEMENT OF AN ULTRA DENSE THERMALLY CHALLENGED SERVER

(71) Applicant: DELL PRODUCTS, LP, Round Rock, TX (US)

(72) Inventors: Eric Tunks, Austin, TX (US); Danny Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 178 days.

(21) Appl. No.: 16/787,652

(22) Filed: Feb. 11, 2020

(65) Prior Publication Data

US 2021/0247730 A1  Aug. 12, 2021

(51) Int. Cl.
*H05K 7/20* (2006.01)
*G05B 19/042* (2006.01)

(52) U.S. Cl.
CPC ....... *G05B 19/042* (2013.01); *H05K 7/20145* (2013.01); *H05K 7/20718* (2013.01); *G05B 2219/49219* (2013.01)

(58) Field of Classification Search
CPC ........ G05B 19/042; G05B 2219/49219; H05K 7/20145; H05K 7/20718
USPC .......................................................... 361/688
See application file for complete search history.

(56) References Cited

U.S. PATENT DOCUMENTS

| | | | |
|---|---|---|---|
| 8,320,121 B2* | 11/2012 | Bisson | H05K 7/20736 361/679.51 |
| 9,392,726 B2 | 7/2016 | Shelnutt et al. | |
| 10,219,365 B1* | 2/2019 | Chen | H01L 23/467 |
| 10,390,462 B2 | 8/2019 | Curtis et al. | |
| 10,506,742 B2* | 12/2019 | Murakami | H05K 5/0217 |
| 10,631,432 B2* | 4/2020 | Gopalakrishna | H05K 7/20181 |
| 2007/0127210 A1* | 6/2007 | Mahalingam | G06F 1/203 361/700 |
| 2008/0041562 A1* | 2/2008 | Bhatia | H01L 23/467 165/80.3 |
| 2009/0046430 A1* | 2/2009 | Brewer | H05K 7/20736 361/701 |
| 2010/0302727 A1* | 12/2010 | Bellin | G06F 1/20 361/679.49 |
| 2011/0182027 A1* | 7/2011 | Lima | G06F 1/20 361/679.46 |
| 2012/0008276 A1* | 1/2012 | Cheng | H05K 7/20145 361/679.48 |
| 2012/0033381 A1* | 2/2012 | Matsumoto | F28F 3/027 361/697 |
| 2012/0050991 A1* | 3/2012 | Tamanuki | H01L 23/467 361/697 |
| 2012/0120600 A1* | 5/2012 | Ji | H05K 7/20572 361/692 |

(Continued)

*Primary Examiner* — Anatoly Vortman
(74) *Attorney, Agent, or Firm* — Larson Newman, LLP

(57) ABSTRACT

An information handling system includes an enclosure having a front portion and a rear portion. An exhaust duct is located in between a first central processing unit and a first set of downstream components within the rear portion. The exhaust duct directs first airflow from the first central processing unit out of the information handling system without the first airflow reaching an inlet of the first set of downstream components. A first top cover is attached to the rear portion. The first top cover includes a first hole cut above the exhaust duct. The first hole enables the first airflow to escape from the rear portion.

20 Claims, 6 Drawing Sheets

(56) References Cited

U.S. PATENT DOCUMENTS

| | | | |
|---|---|---|---|
| 2012/0327589 A1* | 12/2012 | Sun | G06F 1/20 |
| | | | 361/679.47 |
| 2013/0141863 A1* | 6/2013 | Ross | H05K 7/1488 |
| | | | 361/679.33 |
| 2013/0155606 A1* | 6/2013 | Sasaki | G06F 1/20 |
| | | | 361/679.47 |
| 2014/0073234 A1* | 3/2014 | Elison | H05K 7/20836 |
| | | | 454/184 |
| 2014/0293532 A1* | 10/2014 | Schelshorn | H05K 7/20727 |
| | | | 361/679.53 |
| 2016/0057892 A1* | 2/2016 | Tabe | H05K 7/20745 |
| | | | 361/679.46 |
| 2016/0088774 A1* | 3/2016 | Alvarado | H05K 7/1488 |
| | | | 361/679.46 |
| 2018/0235106 A1 | 8/2018 | Curtis et al. | |

* cited by examiner

SYSTEM WITH RETROFIT ENHANCEMENT OF AN ULTRA DENSE THERMALLY CHALLENGED SERVER

FIELD OF THE DISCLOSURE

The present disclosure generally relates to information handling systems, and more particularly relates to improving an ultra dense thermally challenged server.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements may vary between different applications. Thus information handling systems may also vary regarding what information is handled, how the information is handled, how much information is processed, stored, or communicated, and how quickly and efficiently the information may be processed, stored, or communicated. The variations in information handling systems allow information handling systems to be general or configured for a specific user or specific use such as financial transaction processing, airline reservations, enterprise data storage, or global communications. In addition, information handling systems may include a variety of hardware and software resources that may be configured to process, store, and communicate information and may include one or more computer systems, graphics interface systems, data storage systems, networking systems, and mobile communication systems. Information handling systems may also implement various virtualized architectures. Data and voice communications among information handling systems may be via networks that are wired, wireless, or some combination.

SUMMARY

An information handling system includes an enclosure having a front portion and a rear portion. An exhaust duct is located in between a first central processing unit and a first set of downstream components within the rear portion. The exhaust duct directs first airflow from the first central processing unit out of the information handling system without the first airflow reaching an inlet of the first set of downstream components. A first top cover is attached to the rear portion. The first top cover includes a first hole cut above the exhaust duct. The first hole enables the first airflow to escape from the rear portion.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
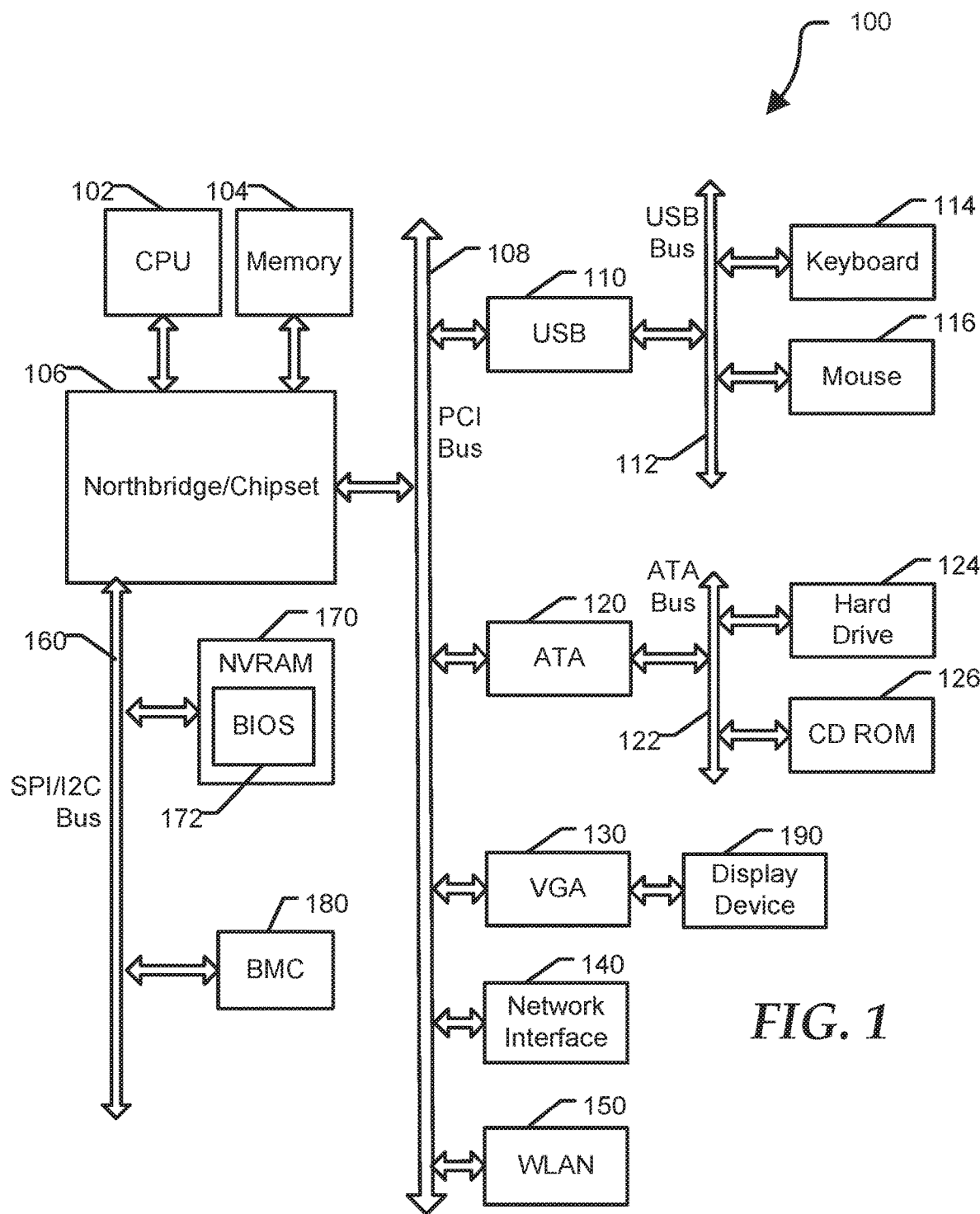
FIG. 1 is a block diagram of a general information handling system according to at least one embodiment of the disclosure.

FIG. 1 illustrates a general information handling system 100 including a processor 102, a memory 104, a northbridge/chipset 106, a PCI bus 108, a universal serial bus (USB) controller 110, a USB bus 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, and a baseboard management controller (BMC) 180. In an embodiment, information handling system 100 may be information handling system 200 of FIG. 2. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional buses, not shown for clarity. For example, system 100 can include multiple processor cores, audio devices, and the like. While a particular arrangement of bus technologies and interconnections is illustrated for the purpose of example, one of ordinary skilled in the art will appreciate that the techniques disclosed herein are applicable to other system architectures. System 100 can include multiple CPUs and redundant bus controllers. One or more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. For example, device controller 130 may provide data to a display device 190 to visually present the information to an individual associated with information handling system 100. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 100 can include a set of instructions that can be executed to cause a processor or circuitry of the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
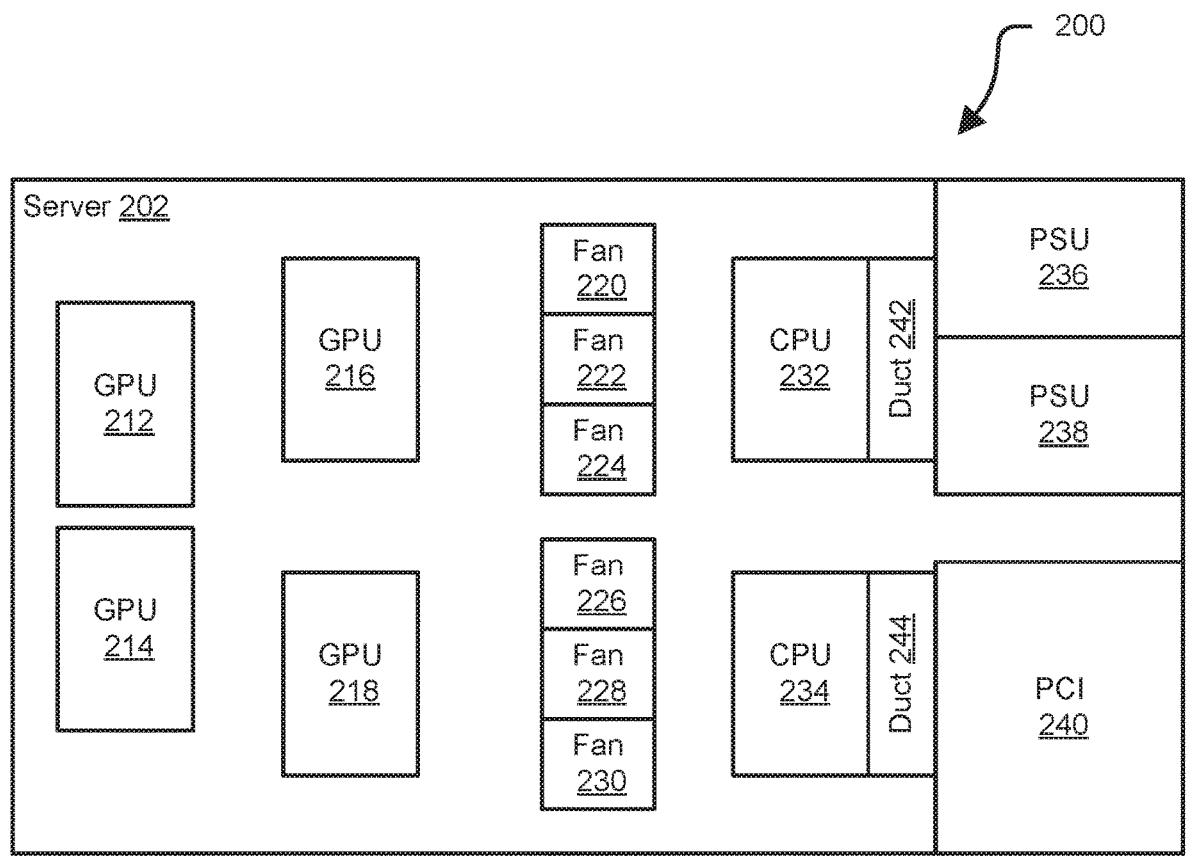
FIG. 2 is a block diagram of a portion of an information handling system retrofitted to improve airflow management within the information handling system according to at least one embodiment of the disclosure.

FIG. 2 shows a portion of an information handling system 200 retrofitted to improve airflow management within the information handling system according to at least one embodiment of the disclosure. Information handling system 200 includes a server 202. Server 202 includes graphics processing units (GPUs) 212, 214, 216, and 218 (212-218), cooling fans 220, 222, 224, 226, 228, and 230 (220-230), central processing units (CPUs) 232 and 234, power supply units (PSUs) 236 and 238, and peripheral component interconnect (PCI) slot locations 240. In certain examples, information handling system 200 may be a modular datacenter, and server 202 may only utilize evaporative cooling, such that the server may have thermal challenges while cooling the components within the server. In an example, server 202 may be any suitable server including, but not limited to, a 1 U server. In an embodiment, GPUs 212-218 may grouped or classified in two or more groups including, but not limited to, upstream GPUs and downstream GPUs. For example, GPUs 212 and 214 may be upstream GPUs and GPUs 216 and 218 may be downstream GPUs. In an example, upstream GPUs 212 and 214 may be considered upstream GPUs based on these GPUs being located in server 202 nearest to a cold aisle of information handling system 200. In an embodiment, airflow through server 202 may enter the server at upstream GPUs 214 and 216 continue across downstream GPUs 216 and 218, through cooling fans 220-230, across CPUs 232 and 234, into air inlets for PSUs 236 and 238, into air inlets for PCI slot locations 240, and then out of the server.

In an example, the components, such as GPUs 212-218, CPUs 232 and 234, PSUs 236 and 238, and the PCI devices within PCI slot location 240, may include different operating specifications, which may indicate any suitable requirements for the components including, but not limited, thermal thresholds for the components. For example, GPUs 212-218 may have a thermal threshold of any suitable temperature value, PSUs 236 and 238 may have a thermal threshold of airflow temperatures at the inlet to the PSUs of any suitable temperature value, and PCI slot location 240 may have a thermal threshold of airflow temperatures at the inlet of any suitable temperature value. However, the density of components within server 202 combined with the power usage of the components may create thermal problems maintaining the required temperature thresholds. For example, each of GPUs 212-218 may consume any suitable amount of power, and each of CPUs 232 and 234 may consume any suitable amount of power. In an example, the power consumption of GPUs 212-218 and CPUs 232 and 234 may increase the airflow temperatures within server 202 to levels above the threshold levels of other downstream components within the server, such as PSUs 236 and 238 and/or PCI slot location 240. For example, the airflow across upstream GPUs 212 and 214 may increase the airflow temperature to a level that may cause the temperature of downstream GPUs 216 and 218 to not be sufficiently cooled, such that the downstream GPUs may not be cooled to temperature below the threshold levels. Additionally, the power consumption of CPUs 232 and 234 may generate sufficient heat to increase the airflow temperature at the inlets of PSUs 236 and 238 and PCI slot locations 240 above the threshold levels. In certain examples, any other suitable environmental condition or internal condition may affect the airflow temperature within server 202. For example, temperatures of airflow within a cold aisle of information handling system 200 may be higher than normally, such as 35° C. instead of a normal 20° C. In an example, server 202 may need to be retrofitted to lower airflow temperatures within the server.

In an embodiment, exhaust ducts 242 and 244 may be inserted within server 202 to divert airflow away from specific areas within the server. For example, exhaust duct 242 may be inserted in between CPU 232 and PSUs 236 and 238. In this example, exhaust duct 242 may divert the hot airflow from CPU 232 up and out of an enclosure of server 202, such that the hot airflow from the CPU does not cause the airflow at the inlet of PSUs 236 and 238 to increase to a level above the threshold of the PSUs. Exhaust duct 244 may be inserted in between CPU 234 and PCI slot location 240. In this example, exhaust duct 244 may divert the hot airflow from CPU 234 up and out of an enclosure of server 202, such that the hot airflow from the CPU does not cause the airflow at the inlet of PCI slot location 240 to increase to a level above the threshold of the PCI slot location. Thus, the addition of exhaust ducts 242 and 244 may improve server 202 by reducing airflow temperatures provided to inlets of PSUs 236 and 238 and to the inlets of PCI slot location 240.

In an example, the diversion of airflow by exhaust ducts 242 and 244 and other improvements discussed below may be possible based on server 202 being placed within information handling system 200 designed for a plurality or 1 U servers but limitations of the information handling system do not allow the information handling system to be fill to capacity. For example, the limitations may including, but are not limited to, power limits of information handling system 200, airflow consumption of the components, weight within the information handling system, the size of server 202, costs, and supported ambient temperatures. In an example, the supported ambient temperatures by the temperature of airflow provided to the front of server 202 and the ability to remove the heated airflow from the rear of the server.

Figure 3:
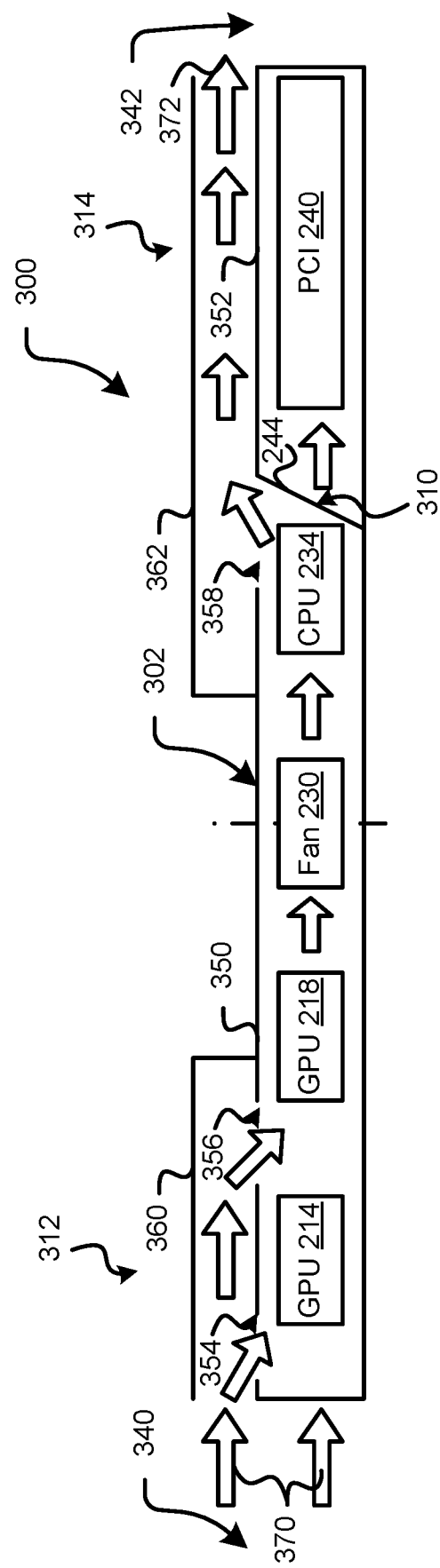
FIG. 3 is a diagram illustrating a side view of the information handling system according to at least one embodiment of the disclosure.

FIG. 3 shows a side view of an information handling system 300 including a server 302. In an example, server 302 may be substantially similarly to server 202 of FIG. 2. A cross section of server 302 is shown such that components within the server are visible in FIG. 3. Server 302 may include the same components as server 202 including, but not limited to, GPUs 214 and 218, a cooling fan 230, CPU 234, and a PCI slot location 240. Server 302 also includes a front top cover 350 and a rear top cover 352. In an example, front top cover 350 may be attached on server 302 over a front portion of the enclosure of the server. Similarly, rear top cover 352 may be attached on server 302 over a rear portion of the enclosure of the server. As stated above with respect to server 202 in FIG. 2, the density of the components within server 302 may have a negative impact on the airflow temperatures within the server. In an example, density of the components may refer to a total number of components within server 302, and how close in proximity the components are located to one another within the server.

In an example, GPU 214 may be an upstream GPU and GPU 218 may be a downstream GPU. The density of components within server 302 may necessitate retrofitting of front top cover 350 and rear top cover 352 to increase airflow, and increase airflow from a cold aisle 340 of information handing system 300, and reduce airflow temperatures provided to the components including, but not limited to, downstream GPU 218 and inlet 310 of PCI slot location 240. In an example, any suitable number of holes may be cut within top covers 350 and 352. For example, holes 354 and 356 may be cut within front top cover 350, and a hole 358 may be cut within rear top cover 352.

In an embodiment, one or more lids, such as lids 360 and 362, may be attached on top covers 350 and 352 ensure that all inlet airflow comes from cold aisle 340 and all hot exhaust air is vented to a hot aisle 342. In an example, cold aisle 340 may be located along the front side of server 302, such that airflow 370 entering the server via lid 360 and a front edge or front portion 312 of the server may be from the cold aisle.

Airflow 370 may travel across and/or through the components of server 302 as shown by arrows within FIG. 3. In an example, fan 230 may pull airflow through hole 354 to upstream GPU 214 and a separate airflow through hole 356 to downstream GPU 218. In an embodiment, the separate airflows to upstream GPU 214 and downstream GPU 218 may increase the cooling of the downstream GPU based on airflow 370 from cold aisle 340 flowing directly to the downstream GPU through hole 356. Cooling fan 230 then may push the airflow across CPU 234 and out of a rear portion 314 of the enclosure of server 302 via hole 358 within rear top cover 352. In an example, exhaust duct 244 may enable the airflow from CPU 234 to flow through hole 358 into lid 362 and into the hot aisle as airflow 372. In an embodiment, airflow other than the airflow from CPU 234 may travel to PCI slot location 240 within server 302. Based on exhaust duct 244 and hole 358 enabling the airflow from CPU 234 to exit server 302 without traveling through PCI slot location 240, the airflow provided to the PCI slot location may be kept below the threshold level. Thus, retrofitting server 302 with exhaust duct 244, holes 354, 356, and 358, and lids 360 and 362 reduces airflow temperatures at downstream GPU 218, PCI slot location 240 and PSUs within the server as compared to a server without these modifications. In an example, exhaust duct 242 and corresponding holes may operating in substantially the same manner as described above with respect to exhaust duct 244 and holes within server 302 to reduce temperatures of downstream GPU and PSU 236 and 238 of FIG. 2.

Figure 4:
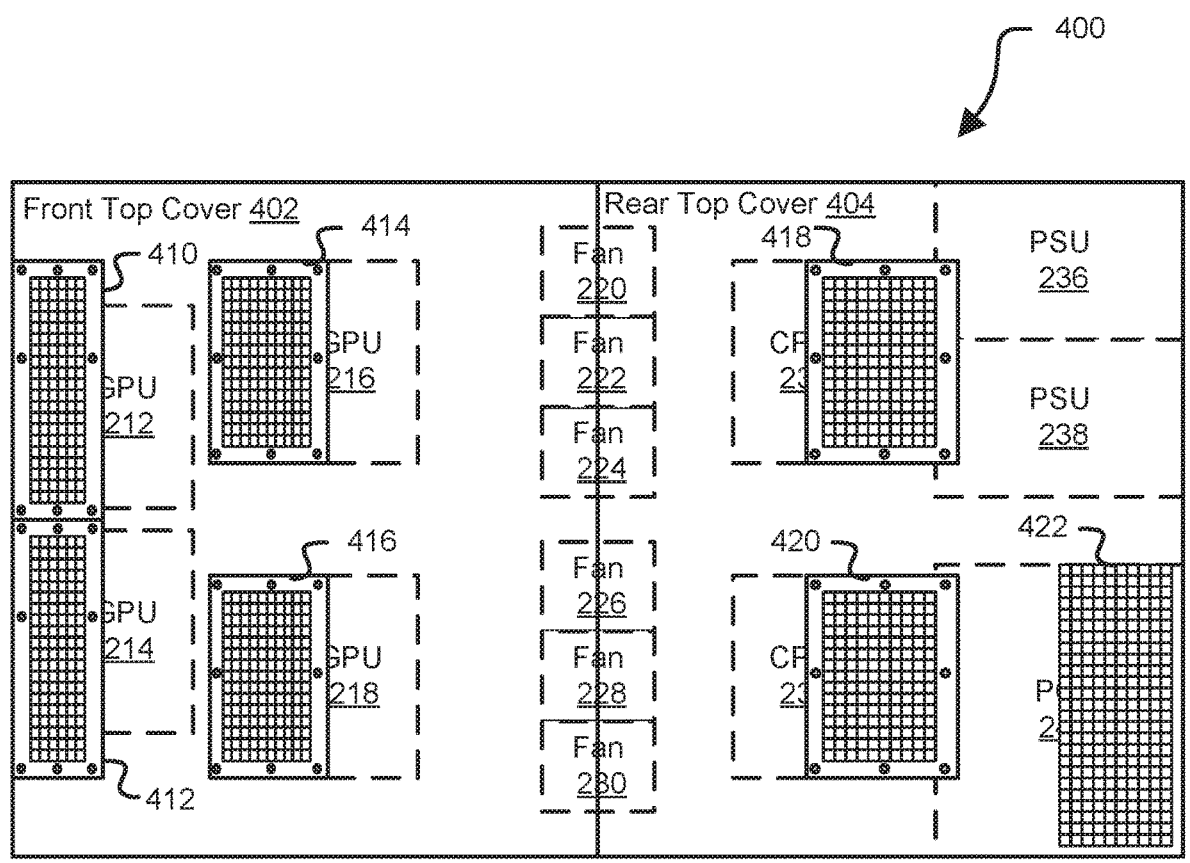
FIG. 4 is a diagram illustrating the information handling system with a front top cover and a rear top cover according to at least one embodiment of the disclosure.

FIG. 4 shows an information handling system, such as a server 400, including a front top cover 402 and a rear top cover 404 connected to the server according to at least one embodiment of the disclosure. Front top cover 402 includes exhaust vents 410, 412, 414, and 416 attached to the front top cover over holes cut within the top cover. Thus, multiple holes may be cut within front top cover 402, such that a different hole is cut in the front top cover at each location of exhaust vents 410, 412, 414, and 416. Rear top cover 404 includes exhaust vents 418 and 420 attached to the rear top cover over holes cut within the rear top cover, and a vent grate 422 incorporated within the rear top cover. Thus, multiple holes may be cut within rear top cover 404, such that a different hole is cut in the rear top cover at each location of exhaust vents 418 and 420. In an example, server 400 may include one or more components including, but not limited to, the components of FIG. 2. For example, server 400 may include GPUs 212, 214, 216, and 218, cooling fans 220, 222, 224, 226, 228, and 230, CPUs 232 and 234, PSUs 236 and 238, and PCI slot locations 240.

In an example, exhaust vents 410 and 412 may be position above and in front of upstream GPUs 212 and 214. In an embodiment, 'in front of' refers to closer to a cold aisle, such as cold aisle 340 of FIG. 3, and 'behind' refers to closer to a hot aisle, such as hot aisle 342 of FIG. 3, of an information handling system. In an example, exhaust vent 410 may provide airflow to upstream GPU 212 through the hole cut in front top cover 402 below the exhaust vent. Similarly, exhaust vent 412 may provide airflow to upstream GPU 214 through the hole cut in front top cover 402 below the exhaust vent. Exhaust vent 414 may be positioned in between upstream GPU 212 and downstream GPU 216. In an example, exhaust vent 414 may provide airflow directly from the cold aisle, such that a temperature of downstream GPU 216 may be reduced as compared to a server without exhaust vent 414. Exhaust vent 416 may be positioned in between upstream GPU 214 and downstream GPU 218. In an example, exhaust vent 416 may provide airflow directly from the cold aisle, such that a temperature of downstream GPU 218 may be reduced as compared to a server without exhaust vent 416.

In an embodiment, exhaust vent 418 may be positioned in rear top cover 404 in between CPU 232 and PSUs 236 and 238. In an example, exhaust vent 418 may be directly above an exhaust duct, such as exhaust duct 242 of FIG. 2, within server 400. The combination of exhaust duct 242 of FIG. 2, the hole below the exhaust vent, and exhaust vent 418 may enable hot airflow from CPU 232 to be expelled from server 400, such that a temperature of airflow provided to PSUs 236 and 238 is reduced as compared to a server without the exhaust duct, the hole, and the exhaust vent. Exhaust vent 420 may be positioned in rear top cover 404 in between CPU 234 and PCI slot location 240. In an example, exhaust vent 420 may be positioned may be directly above an exhaust duct, such as exhaust duct 244 of FIG. 2, within server 400. The combination of exhaust duct 244 of FIG. 2, hole 358 of FIG. 3, and exhaust vent 420 may enable hot airflow from CPU 234 to be expelled from server 400, such that a temperature of airflow provided to PCI slot location 240 is reduced as compared to a server without the exhaust duct, the hole, and exhaust vent. Thus, retrofitting server 400 with exhaust vents 410, 412, 414, 416, 418, and 420 reduces airflow temperatures at downstream GPUs 216 and 218, PSUs 236 and 238, and PCI slot location 240, within the server as compared to a server without these modifications.

Figure 5:
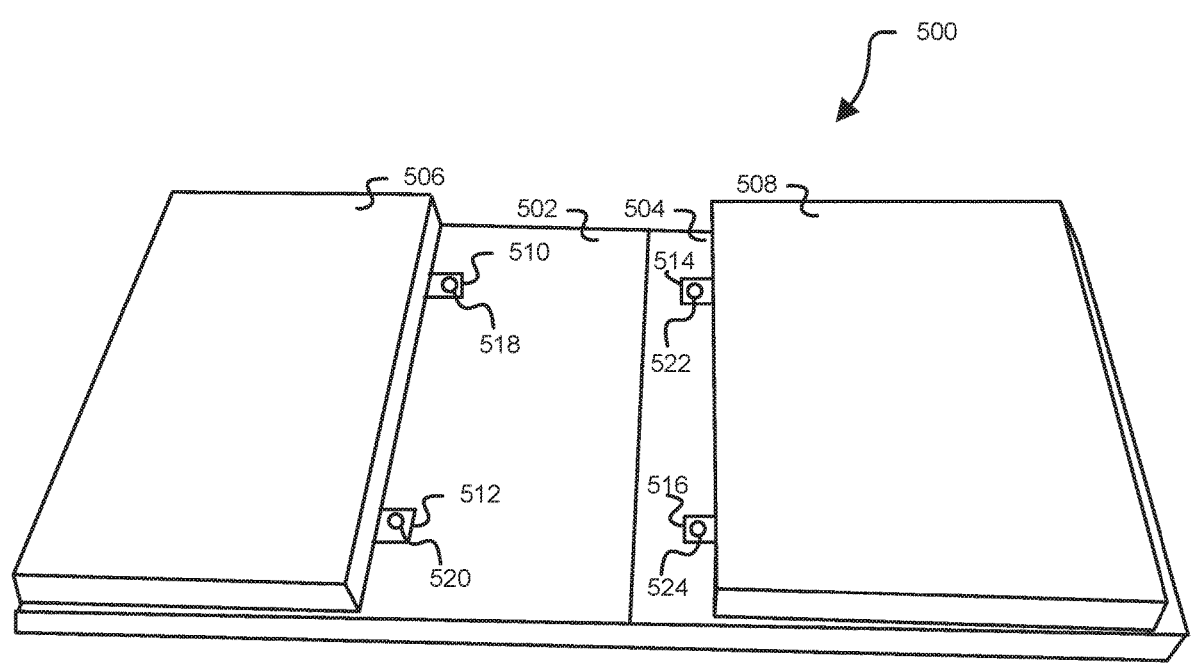
FIG. 5 is a diagram illustrating the information handling system with a front lid and a rear lid attached to the information handling system according to at least one embodiment of the disclosure.

FIG. 5 shows a server 500 include a front top cover 502, a rear top cover 504, a front lid 506, and a rear lid 508 according to at least one embodiment of the disclosure. In an example, front lid 506 may be substantially the same as lid 360 of FIG. 3, and rear lid 508 may be substantially the same as lid 362 of FIG. 3. Front lid 506 includes tabs 510 and 512. Rear lid incudes tabs 514 and 516. In an embodiment, tabs 510 and 512 may be utilized to attach front lid 506 to front top cover 502. Similarly, tabs 514 and 516 may be utilized to attach rear lid 508 to rear top cover 504.

In an example, lids 506 and 508 may be attached to respective top covers 502 and 504 in any suitable manner. For example, a screw 518 may be inserted through a hole in tab 510, and a screw 520 may be inserted through a hole in tab 512. Screw 518 may be tighten on tab 510 and screw 520 may be tighten on tab 512 to secure front lid 506 to front top cover 502. A screw 522 may be inserted through a hole in tab 514, and a screw 524 may be inserted through a hole in tab 516. Screw 522 may be tighten on tab 514 and screw 522 may be tighten on tab 516 to secure rear lid 508 to rear top cover 504. In an example, screws 518, 520, 522, and 524 may be any suitable type of screw including, but not limited to, thumb screws, such that the screws may be tightened or loosened by hand without the use of a tool.

In an embodiment, front lid 506 may be attached to front top cover 502 in a manner to enable the front top cover to be removed from server 500 while the front lid is still attached to the front top lid. Similarly, rear lid 508 may be attached to rear top cover 504 in a manner to enable the front top cover to be removed from server 500 while the rear lid is still attached to the rear top lid. In an example, lid 506 includes a top surface and three side surfaces, such that only the side of the lid facing the cold aisle is open. This configuration of lid 506 ensures the only airflow to enter server 500 comes from the cold aisle. In an example, lid 508 includes a top surface and three side surfaces, such that only the side of the lid facing the hot aisle is open. This configuration of lid 508 ensures the airflow that exists server 500 is provides to the hot aisle. In certain examples, the enclosure of server 500 below front top cover 502 and rear top cover 504 may be a first height, such as a 1 U server height, and with the addition of lids 506 and 508 may be a second height, such as a 2 U server height.

Figure 6:
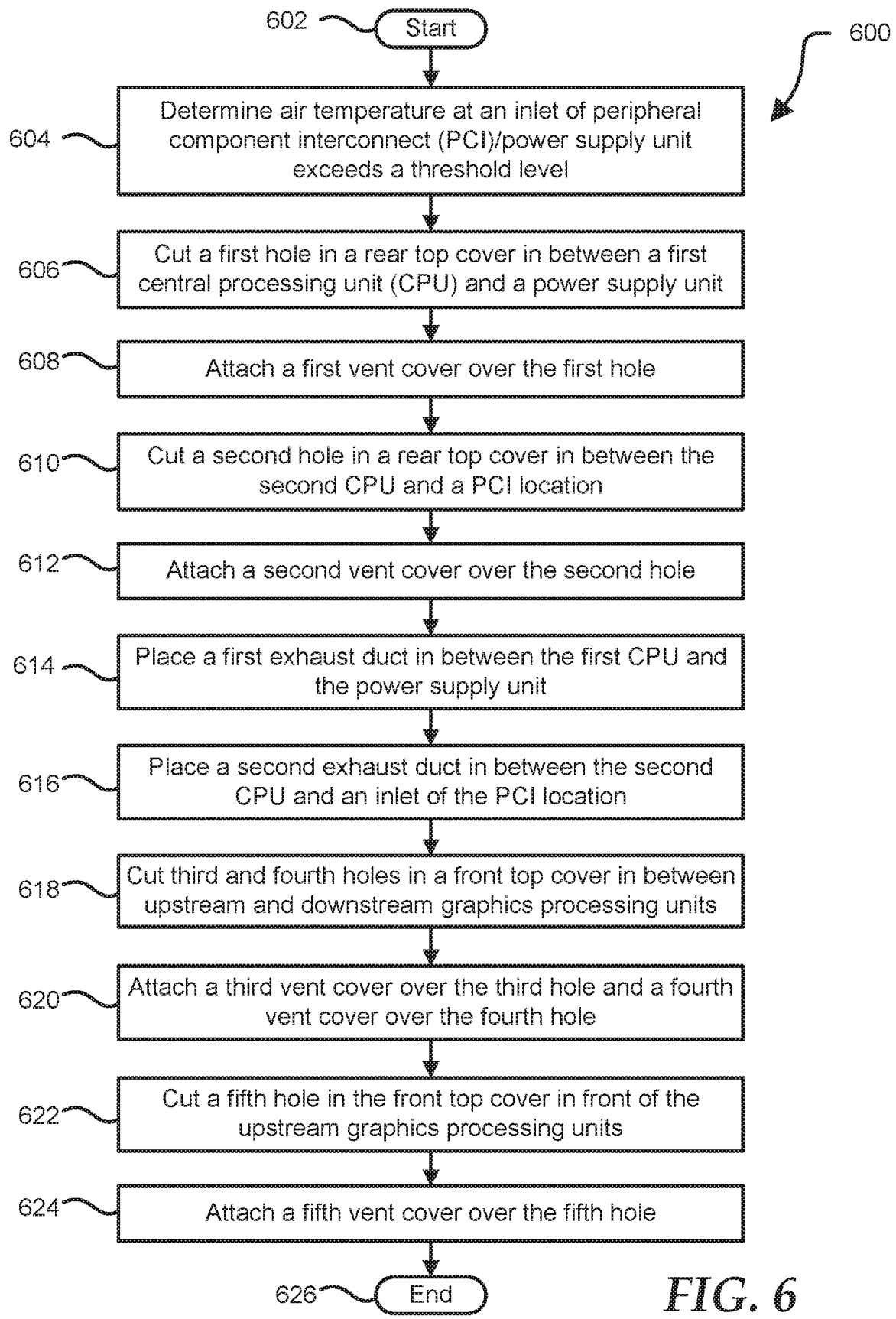
FIG. 6 is a flow diagram illustrating a method for retrofitting a high dense thermally challenged server according to at least one embodiment of the disclosure.

FIG. 6 shows another method 600 for retrofitting a high dense thermally challenged server according to at least one embodiment of the disclosure, starting at block 602. It will be readily appreciated that not every method step set forth in this flow diagram is always necessary, and that certain steps of the methods may be combined, performed simultaneously, in a different order, or perhaps omitted, without varying from the scope of the disclosure. FIG. 6 may be employed in whole, or in part, for any such as information handling system 100 depicted in FIG. 1, information handling system 200 described in FIG. 2, information handling system 300 described in FIG. 3, information handling system 400 described in FIG. 4, or information handling system 500 described in FIG. 5.

At block 604, an air temperature at an inlet of a PCI slot location or power supply unit is determined to exceed a threshold level. In an embodiment, the threshold level may be any suitable temperature level including, but not limited to, a temperature level that exceeds a temperature for within a specification for the PCI slot location or the power supply unit.

At block 606, a first hole is cut in a rear top cover in between a first CPU and a power supply unit. At block 608, a first vent cover is attached to the rear top cover over the first hole. At block 610, a second hole is cut in the rear top cover in between a second CPU and a PCI slot location. At block 612, a second vent cover is attached to the rear top cover over the second hole.

At block 614, an exhaust duct is placed in between the first CPU and the power supply unit. At block 616, an exhaust duct is placed in between the second CPU and a PCI slot location. In an example, the exhaust ducts may extend from a lower edge of a CPU to an upper edge of the PCI slot location or power supply unit. Each exhaust duct may direct airflow from a CPU up and out of the server. In an example, the airflow may be heated up as it crosses the CPUs but the exhaust ducts may prevent the heated airflow from increasing airflow temperatures at the PCI slot location and the power supply unit by directing the heated air flow out of the server.

At block 618, third and fourth holes are cut in a front top cover in between upstream GPUs and downstream CPUs. At block 620, a third vent is attached to the front top cover over the third hole and a fourth vent is attached to the front top cover over the fourth hole. The third and fourth holes enable airflow from a cold aisle to flow directly to the downstream GPUs. Thus, the third and fourth holes may reduce temperatures at the downstream GPUs by airflow from the cold aisle being provided directly to the downstream GPUs. At block 622, a fifth hole is cut in the front top cover in front of the upstream GPUs. At block 624, a fifth vent cover is attached to the front top cover over the fifth hole. The method ends at block 626.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module may include software, including firmware embedded at a processor or software capable of operating a relevant environment of the information handling system. The device or module may also include a combination of the foregoing examples of hardware or software. Note that an information handling system may include an integrated circuit or a board-level product having portions thereof that may also be any combination of hardware and software.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
an enclosure including a front portion and a rear portion;
an exhaust duct located in between a first central processing unit and a first set of downstream components within the rear portion, the exhaust duct to direct a first airflow from the first central processing unit out of the information handling system without the first airflow reaching an inlet of the first set of downstream components; and
a first top cover attached to the rear portion, the first top cover including a first hole cut above the exhaust duct, the first hole to enable the first airflow to escape from the rear portion.

2. The information handling system of claim 1, further comprising:
a first lid attached to the first top cover, the first lid to direct the first airflow from the rear portion to a hot aisle of the information handling system.

3. The information handling system of claim 2, wherein the first lid includes a tab, wherein the first lid is attached to the first top cover via a screw.

4. The information handling system of claim 1, further comprising:
a second top cover attached to the front portion, the first top cover including a second hole cut above a first location within a front location, wherein the first location is in between an upstream graphics processing unit and a downstream graphics processing unit, the second hole to enable a second airflow to be directed from a cold aisle of the information handling system directly to the downstream graphics processing unit.

5. The information handling system of claim 3, further comprising:
a second lid attached to the second top cover, the second lid to direct the second airflow from the cold aisle to the front portion.

6. The information handling system of claim 5, wherein the second lid includes a tab, wherein the second lid is attached to the second top cover via a screw.

7. The information handling system of claim 6, wherein the second top cover is removable from the information handling system with the second lid attached to the second top cover.

8. The information handling system of claim 1, further comprising:
a plurality of cooling fans, the cooling fans to push the first airflow across the first central processing unit and out of the information handling system via the exhaust duct and the first hole.

9. The information handling system of claim 1, further comprising:
an exhaust vent attached over the first hole, a first exhaust vent enable the first airflow to exit the rear portion.

10. An information handling system, comprising:
an enclosure including a front portion and a rear portion;
an exhaust duct located in between a first central processing unit and a first set of downstream components within the rear portion, the exhaust duct to direct a first airflow from the first central processing unit out of the information handling system without the first airflow reaching an inlet of the first set of downstream components;
a first top cover attached to the rear portion, the first top cover including a first hole cut above the exhaust duct, the first hole to enable the first airflow to escape from the rear portion;
a second top cover attached to the front portion, the second top cover including a second hole cut above a first location within a front location, wherein the first location is in between an upstream graphics processing unit and a downstream graphics processing unit, the second hole to enable a second airflow to be directed from a cold aisle of the information handling system directly to the downstream graphics processing unit; and
a plurality of cooling fans to pull the second airflow from the cold aisle across the downstream graphics processing unit, and to push the first airflow across the first central processing unit and out of the information handling system.

11. The information handling system of claim 10, further comprising:
a first lid attached to the first top cover, the first lid to direct the first airflow from the rear portion to a hot aisle of the information handling system.

12. The information handling system of claim 11, wherein the first lid includes a tab, wherein the first lid is attached to the first top cover via a screw.

13. The information handling system of claim 12, further comprising:
a second lid attached to the second top cover, the second lid to direct the second airflow from the cold aisle to the front portion.

14. The information handling system of claim 13, wherein the second lid includes a tab, wherein the second lid is attached to the second top cover via a screw.

15. The information handling system of claim 14, wherein the second top cover is removable from the information handling system with the second lid attached to the second top cover.

16. An information handling system, comprising:
an enclosure including a front portion and a rear portion;
an exhaust duct located in between a first central processing unit and a first set of downstream components within the rear portion, the exhaust duct to direct a first airflow from the first central processing unit out of the information handling system without the first airflow reaching an inlet of the first set of downstream components;
a first top cover attached to the rear portion, the first top cover including a first hole cut above the exhaust duct, the first hole to enable the first airflow to escape from the rear portion;
a second top cover attached to the front portion, the second top cover including a second hole cut above a first location within a front location, wherein the first location is in between an upstream graphics processing unit and a downstream graphics processing unit, the second hole to enable a second airflow to be directed from a cold aisle of the information handling system directly to the downstream graphics processing unit;
a first lid attached to the first top cover, the first lid to direct the first airflow from the rear portion to a hot aisle of the information handling system; and
a second lid attached to the second top cover, the second lid to direct the second airflow from the cold aisle to the front portion.

17. The information handling system of claim 16, wherein the first lid includes a tab, wherein the first lid is attached to second top cover via a screw.

18. The information handling system of claim 16, wherein the second lid includes a tab, wherein the second lid is attached to second top cover via a screw.

19. The information handling system of claim 18, wherein the second top cover is removable from the information handling system with the lid attached to second top cover.

20. The information handling system of claim 16, further comprising:
a plurality of cooling fans, the cooling fans to push the first airflow across the first central processing unit and out of the information handling system.

* * * * *